May 20, 1958 J. M. CLUWEN 2,835,747

MAGNETIC OR DIELECTRIC AMPLIFIER

Filed March 12, 1954

INVENTOR
JOHANNES MEIJER CLUWEN

BY

AGENT 2,835,747
Patented May 20, 1958

2,835,747

MAGNETIC OR DIELECTRIC AMPLIFIER

Johannes Meijer Cluwen, Eindhoven, Netherlands, assignor, by mesne assignments, to North American Philips Company, Inc., New York, N. Y., a corporation of Delaware Application March 12, 1954, Serial No. 415,939

Claims priority, application Netherlands March 23, 1953

4 Claims. (Cl. 179—171)

The invention relates to amplifiers comprising a material having a non-linear electrical characteristic, such as a magnetic or dielectric amplifier, comprising an oscillation supply by means of which a magnetic or dielectric material respectively is controlled in the non-linear part of its polarisation characteristic, a signal source supplying a signal of lower frequency than that of the supply oscillation for modulating the polarisation degree of the material, and a detector circuit for detecting the modulated oscillation thus obtained.

The amplification characteristic of such amplifiers, indicating the relationship between the instantaneous value of the signal oscillation and that of the detector output oscillation, is found to have in general a non-linear course. This means that, if the signal source supplies an alternating current or an alternating voltage in general higher harmonics of the input oscillation supplied by the signal source will be produced in the detection output which is termed non-linear distortion.

Attempts are made to minimize this non-linear distortion by adjusting the amplifier by means of a suitable adjusting polarisation to as good a linear part of the amplification characteristic as possible and by superimposing the oscillation supplied by the signal source on this adjusting polarisation. In a magnetic amplifier this adjusting polarisation may be obtained by means of a direct current traversing a winding provided on the ferromagnetic material or by means of a permanent magnet, in a dielectric amplifier by means of a direct voltage supplied to capacitors comprising the dielectric material or, if the dielectric material is suitable for this purpose, by producing an internal remanent polarisation in the material.

Apart from the fact that the suppression of the higher harmonics, is, of course, not complete, particularly the second and the third harmonic having a troublesome effect, the amplitude of the oscillations supplied by the signal source is, in this method, comparatively sharply limited, since, if the amplifier is controlled beyond that part of the amplification characteristic which is considered to be linear and which is fixed for the adjusting polarisation, the distortion will grow rapidly to an inadmissible extent.

The invention has for its object to provide such an amplification with less non-linear distortion and is characterized in that the polarisation degree of the material is at the same time modulated by an auxiliary oscillation, the frequency of which lies between that of the signal oscillation and that of the supply oscillation, in that the said detector circuit includes a selective network, across which a signal oscillation modulated by the auxiliary oscillation is produced and in that a second detector circuit is coupled with the selective network for producing the amplified signal.

The invention will now be described with reference to the accompanying drawing.

Figure 1:
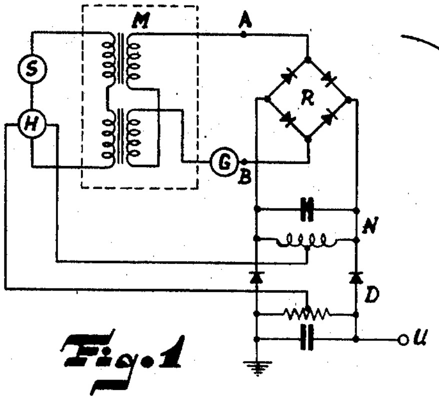
Fig. 1 shows a device of the magnetic type according to the invention.
Figure 2:
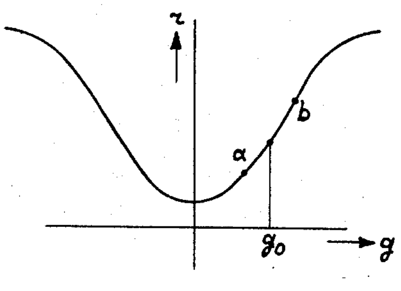
Fig. 2 shows a characteristic curve of such a device.

Referring to Fig. 1, M designates the modulator part of a magnetic amplifier. In the present case M comprises two transformers, the cores of which have a non-linear polarisation characteristic. The primary windings are connected in series, the secondary windings in series opposition. G designates a supply generator, which controls the ferromagntic cores in the non-linear parts of their polarisation characteristic curves. If a direct current $g$ is supplied to the primary windings, the amplitude $r$ of the oscillation occurring between points $a$ and $b$ varies as a function of this direct current $g$ as is indicated in Fig. 2; this amplitude $r$ may be detected by means of a detector circuit.

In the conventional magnetic amplifiers the adjustment is carried out by means of a direct current $g_0$ or by means of a permanent magnet to such a point of the $r$—$g$ characteristic that in the proximity of this point the relationship between $r$ and $g$ is as linear as possible. If a signal S is supplied to the primary windings, as a signal superimposed on the adjusting polarisation $g_0$, an amplified, but distorted signal is produced at the output of the detector circuit, since the said $r$—$g$-characteristic is, properly speaking, not linear. Moreover, the amplitude of the input signal is subjected to comparatively sharp limits, since this amplitude must not exceed the part $a$—$b$ of the $r$—$g$-characteristic, which is considered to be linear, in order to prevent the distortion to become inadmissibly great.

In the distortion due to the higher harmonics of the signal, particularly the second harmonic and the third harmonic have a troublesome effect, since their intensity is, in general, highest and since, moreover, they are suppressed by means of filters only with difficulty.

If, in accordance with the invention, instead of using adjusting polarisation $g_0$, the polarisation degree of the material is modulated not only by the signal S, but also by the auxiliary oscillation H, the frequency of which lies between that of the signal S and that of the supply oscillation G, and if the detector circuit comprises a selective network N, tuned to the frequency of the auxiliary oscillation H, it is found that across this network N an oscillation is produced, which, subsequent to detection supplies the amplified signal S which is not distorted by even-numbered harmonics, particularly the second harmonic, whilst with a definite choice of the amplitude of the auxiliary oscillation H also the third harmonic may be suppressed in the amplified signal without the requirement for the r—g-characteristic to have parts which may be considered to be at least approximately linear.

This will be evident from the $r$—$g$-characteristic curve shown in Fig. 2. In view of the symmetry of this curve with respect to the $r$-axis, the functional relationship between $r$ and $g$ may be written as follows:

$$r=a_0+a_2g^2+a_4g^4+a_6g^6+ \dots \qquad (1)$$

According to the invention, the amplifier has supplied to it not only the signal S to be amplified, but also an auxiliary oscillation H, having an angular frequency $w_h$ lying between that of the signal and that of the supply oscillation. This auxiliary oscillation may be written:

$$H=h \cos w_ht \qquad (2)$$

This means that $g$ varies with $$g=h \cos w_ht+S \qquad (3)$$

According to the invention the detector circuit, which supplies the detection output oscillation $r$, comprises a selective network, N, tuned to the frequency of the auxiliary oscillation H. Consequently, across this network occur those components of $r$ which contain $\cos w_h t$.

After introducing the expression (3) into the expression (1) and after replacement of $\cos^2 w_h t$ by $\frac{1}{2}+\frac{1}{2}\cos^2 w_h t$ and so on, for the component having $\cos w_h t$ is found:

$$r(w_h)=\cos w_h t\Big(S(2a_2h+3a_4h^3+\frac{15}{4}a_6h^5+\ldots)+S^3(4a_4h+15a_6h^3+\ldots)+S^5(6a_6h+\ldots)+\ldots\Big)$$

This is consequently a modulated oscillation, the carrier wave of which is suppressed. If a suitable detector circuit D has now supplied to it both $r(w_h)$ and the auxiliary oscillation H the output U of this circuit has produced across it a signal $S_u$, which is proportional to the expression between accolades in $r(w_h)$:

$$S_u=A(c_1S+c_3S^3+c_5S^5+\ldots)$$

wherein A designates a constant $$c_1=(2a_2h+3a_4h^3+\frac{15}{4}a_6h^5\ \ldots)$$

$$c_2=(4a_4h+15a_6h^3+\ldots)$$

and $$c_3=(6a_6h+\ldots)$$

The final detector output consequently does not contain even-numbered harmonics of the signal oscillation initially supplied to the amplifier; particularly the suppression of the second harmonic is of importance.

However it is also possible to suppress to a considerable extent the third harmonic, which, apart from the second harmonic, has the most troublesome effect from the final detection output oscillation by reducing the aforesaid coefficient $c_3$ to zero. The amplitude $h$ of the auxiliary oscillation H may be chosen to be such that $c_3$ becomes indeed zero. The condition is that at least one of the coefficients $a_4$, $a_6$ . . . should be negative. However, from the fact that the curve $r=f(g)$ has at least one bend both for positive and for negative values of $g$, it follows that this must indeed be the case.

Figure 3:
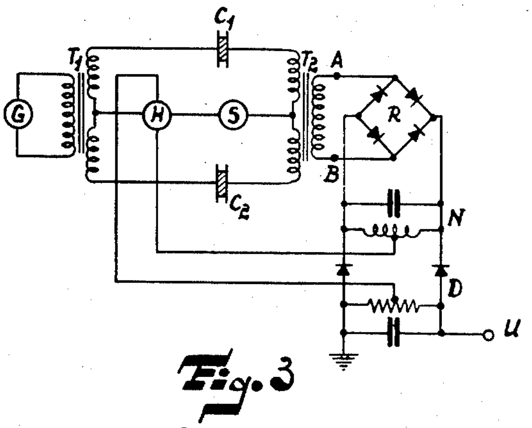
Fig. 3 shows a device of the dielectric type according to the invention.

Fig. 3 shows one embodiment of an amplifier of the dielectric type according to the invention. $C_1$ and $C_2$ designate capacitors comprising a dielectric medium having a non-linear polarisation characteristic; $T_1$ and $T_2$ designate separation transformers. G designates a supply generator, which controls the dielectric media in the non-linear part of their polarisation characteristic curve. H designates the source of the auxiliary oscillation and S the signal source. The oscillation at the terminals A and B is supplied via the rectifying circuit R to the selective network N; R and N thus form together the detector circuit comprising a selective network N tuned to the frequency of the auxiliary oscillation H. The output oscillation of this detector R—N is, together with the auxiliary oscillation H, supplied to the detector D, from the output U of which the amplified signal can be taken.

Figure 4:
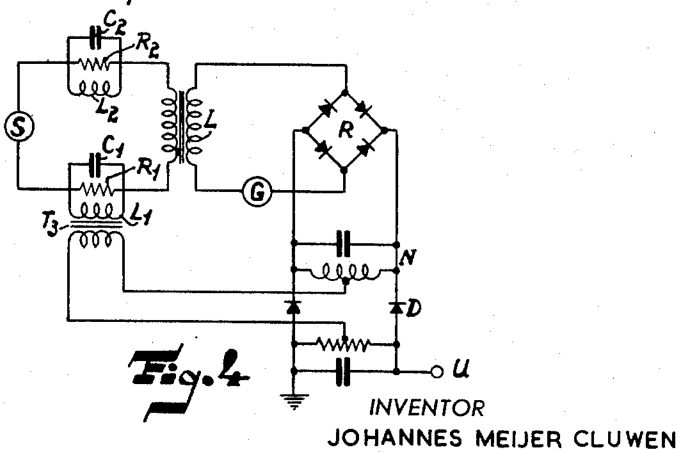
Fig. 4 shows a device according to the invention, in which the auxiliary oscillation is produced spontaneously.

In the embodiments shown in Figs. 1 and 3 the auxiliary oscillation H is introduced into the circuits by a suitable source of oscillations. However, as an alternative, this auxiliary oscillation H may be produced spontaneously in the amplifier in a manner known per se. Fig. 4 shows one embodiment of such a magnetic amplifier. L designates a transformer having a ferro-magnetic core, the polarisation characteristic of which is not linear, G designates a source of supply oscillations, which controls this ferromagnetic core in the non-linear part of its polarisation characteristic curve. $L_1$, $C_1$, $R_1$ and $L_2$, $C_2$, $R_2$ designate two circuits, one of which is tuned to a frequency $f_1$ and the other to a frequency $f_2$; these frequencies may, for example be such that $f_1+f_2=2f$, wherein $f$ designates the frequency of the supply oscillation. It is found that in such an arrangement oscillations having frequencies $f_1$ and $f_2$ are produced spontaneously, if the resonance impedance of the circuits $L_1$, $C_1$, $R_1$ and $L_2$, $C_2$, $R_2$ is sufficiently high. Frequency $f_1$ may be chosen to be such that $f_1$ lies between the frequency of the signal to be amplified and the frequency $f$ the supply oscillation. If in the circuit operates also the signal source S, the network N of the detector comprising the rectifying network R and the network N has produced across it an oscillation $r(w_h)$, as indicated above, wherein $w_h$ is $2\pi f_1 \cdot r(w_h)$, together with an oscillation having a frequency $f_1$, derived through a transformer $T_3$ from the circuit $L_1$, $C_1$, $R_1$, is supplied to the detector D, across the output U of which occurs the signal $S_u$.

Also with the dielectric amplifier according to the invention the auxiliary oscillation may, of course, be produced spontaneously by analogous measures.

It will be evident that the invention is not confined to the embodiments shown in the figures. As an alternative, the modulator parts of the amplifier may be connected single or in push-pull, the rectifier R, constructed as a Grätz circuit, may be replaced by any other rectifier and so on.

What is claimed is:

1. An amplifier circuit comprising an amplifier device containing a material having a region of non-linear electrical polarization characteristic, a source of supply oscillations having a given frequency, means connected to apply said supply oscillations to said material to polarize said material at said non-linear region, a source of signal oscillations having a frequency lower than said given frequency, means connected to apply said signal oscillations to said material to modulate the degree of polarization of said material, a source of auxiliary oscillations having a frequency which lies between that of said signal oscillations and said supply oscillations, means connected to apply said auxiliary oscillations to said material to modulate the degree of polarization of said material, a first detector circuit connected to said amplifier device to receive the signals amplified by the action of said material in said amplifier device, a selective network connected to the output of said detector circuit and tuned to the frequency of said auxiliary oscillations, a second detector circuit connected to the output of said selective network, whereby the output signal of said selective network constitutes a first input signal to said second detector and means connecting said source of auxiliary oscillations to provide a second input signal to said second detector circuit.

2. An amplifier circuit in accordance with claim 1, in which said source of auxiliary oscillations comprises a tuned circuit connected to said amplifier device.

3. An amplifier circuit in accordance with claim 1, in which said material is a magnetic material.

4. An amplifier circuit in accordance with claim 1, in which said material is a dielectric material.

References Cited in the file of this patent

UNITED STATES PATENTS

| | | |
|---|---|---|
| 1,847,079 | Burton | Mar. 1, 1932 |
| 2,073,477 | Green | Mar. 9, 1937 |
| 2,556,083 | Hepp | June 5, 1951 |
| 2,573,818 | Votruba | Nov. 6, 1951 |
| 2,616,989 | Hepp | Nov. 4, 1952 |

FOREIGN PATENTS

| | | |
|---|---|---|
| 421,516 | Great Britain | Dec. 21, 1934 |